United States Patent
Stevens et al.

(10) Patent No.: US 7,492,404 B2
(45) Date of Patent: Feb. 17, 2009

(54) FAST FLUSH STRUCTURE FOR SOLID-STATE IMAGE SENSORS

(75) Inventors: Eric G. Stevens, Webster, NY (US); John P. Shepherd, Rochester, NY (US); David N. Nichols, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 636 days.

(21) Appl. No.: 11/052,347

(22) Filed: Feb. 7, 2005

(65) Prior Publication Data

US 2006/0044432 A1 Mar. 2, 2006

Related U.S. Application Data

(60) Provisional application No. 60/605,029, filed on Aug. 27, 2004.

(51) Int. Cl.
*H04N 3/14* (2006.01)

(52) U.S. Cl. ............... 348/314; 348/294; 348/299; 348/311; 257/223; 257/230; 257/445; 257/448

(58) Field of Classification Search ............... 348/294, 348/299, 302, 303, 304, 230.1, 311, 314, 348/316, 317; 257/297, 223, 231, 230, 445, 257/448

See application file for complete search history.

(56) References Cited

U.S. PATENT DOCUMENTS

| | | | | |
|---|---|---|---|---|
| 4,435,897 A | | 3/1984 | Kuroda et al. | |
| 4,492,980 A | * | 1/1985 | Harada | 348/245 |
| 4,696,021 A | * | 9/1987 | Kawahara et al. | 377/58 |
| 5,115,458 A | * | 5/1992 | Burkey et al. | 377/58 |
| 5,585,298 A | * | 12/1996 | Stevens et al. | 438/79 |
| 5,702,971 A | * | 12/1997 | Stevens | 438/79 |
| 5,798,542 A | * | 8/1998 | Anagnostopoulos et al. | 257/232 |
| 5,867,215 A | * | 2/1999 | Kaplan | 348/315 |
| 5,903,021 A | * | 5/1999 | Lee et al. | 257/292 |
| 5,923,370 A | * | 7/1999 | Miethig et al. | 348/320 |
| 5,986,297 A | | 11/1999 | Guidash et al. | |
| 6,218,692 B1 | | 4/2001 | Guidash et al. | |
| 6,825,059 B2 | | 11/2004 | Fossum | |
| 7,388,239 B2 | | 6/2008 | Fossum et al. | |
| 2002/0060329 A1 | | 5/2002 | Yoshihara | |
| 2003/0133026 A1 | | 7/2003 | Shepherd et al. | |
| 2004/0160522 A1 | | 8/2004 | Fossum et al. | |

FOREIGN PATENT DOCUMENTS

EP 1 137 071 9/2001

* cited by examiner

*Primary Examiner*—Ngoc-Yen T Vu
*Assistant Examiner*—Peter Chon
(74) *Attorney, Agent, or Firm*—Peyton C. Watkins

(57) ABSTRACT

An image sensor includes a substrate; a plurality of pixels on the substrate, one or more of the pixels comprises (i) first and second charge-storage regions having at least one photosensitive area; (ii) a lateral overflow drain; (iii) a first lateral overflow gate adjacent the first charge-storage regions that passes substantially all charges from the first charge-storage region to the lateral overflow drain; and (iv) a second lateral gate adjacent the second charge-storage region that passes excess photo-generated charge into the lateral overflow drain for blooming control.

4 Claims, 3 Drawing Sheets

FAST FLUSH STRUCTURE FOR SOLID-STATE IMAGE SENSORS

CROSS REFERENCE TO RELATED APPLICATIONS

This application claims priority of provisional application Ser. No. 60/605,029 filed Aug. 27, 2004.

FIELD OF THE INVENTION

The invention relates generally to the field of image sensors and, more particularly, to a flash flush structure for such image sensors.

BACKGROUND OF THE INVENTION

Most current-day, digital-still cameras (DSCs) usually employ a charge-coupled device (CCD) sensor for image capture. These image sensors include a two-dimensional array of photosites. The photosites, or pixels as they are commonly referred to in the art, collect incoming photons and convert them to electron-hole pairs (EHPs). The number of EHPs generated is a linear function of sensor-plane irradiance and a non-linear function of wavelength. Typically, the electrons from these EHPs are collected within the photosites, and subsequently transferred as charge packets within the CCD to an output structure wherein they are converted to a voltage. This voltage signal is detected by off-chip circuitry, which processes these signals and converts them into a digital image. In addition to the signal electrons contained within each charge packet, there is an unavoidable quantity of electrons that get collected as a result of dark-current generation. Since this additional dark-current charge did not result from the incoming image photons, it represents noise, and is hence, undesirable since it reduces the signal-to-noise ratio of the image. Therefore, it is desirable to suppress or eliminate as much of this dark-current charge as possible. There have been many manufacturing and device operational methods employed in the past to reduce the dark signal, as are well known in the art. For example, defect or impurity gettering methods can reduce the generation from depletion-region and/or bulk states, while accumulation-mode clocking is effective at suppressing the generation from surface-states. This is discussed in U.S. Pat. No. 5,115,458.

During normal, single-shot operation of a DSC, this dark current is collected prior to and during image integration, as well as the readout period. Reduction of the dark-current charge that accumulates in the period just prior to image capture, can be accomplished by quickly "flushing" the image area as described by Shepherd, et al. in U.S. Publication No. 2003/0133026. This method basically consists of quickly clocking out the CCD after the shutter button is depressed. The time between when the shutter button is depressed and the shutter actually opens is often referred to as the shutter latency or lag time. Although this prior-art flush method is highly effective, the more pixels the sensor contains, the longer it takes to accomplish. Therefore, as the trend in the industry for more and more pixels continues, the shutter lag starts to become noticeable and objectionable to the photographer. Also, high-speed clocking of the CCDs to flush out the residual dark current in accordance with U.S. Publication No. 2003/0133026 requires a significant amount of power. Therefore, there exists a need in the art to reduce the shutter latency and power consumption.

Consequently, the present invention describes a structure that allows quick and efficient removal of any dark current accumulated within the CCDs just prior to image capture for reduced shutter latency, while reducing power dissipation.

SUMMARY OF THE INVENTION

The present invention is directed to overcoming one or more of the problems set forth above. Briefly summarized, according to one aspect of the present invention, the invention resides in an image sensor having a substrate; a plurality of pixels on the substrate, one or more of the pixels comprising: (i) first and second charge-storage regions having at least one photosensitive area; (ii) a lateral overflow drain; (iii) a first lateral overflow gate adjacent the first charge-storage regions that passes substantially all charges from the first charge-storage region to the lateral overflow drain; and (iv) a second lateral gate adjacent the second charge-storage region that passes excess photo-generated charge into the lateral overflow drain for blooming control.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of reducing shutter latency, dark current in the final image, and power consumption.

DETAILED DESCRIPTION OF THE INVENTION

Figure 1:
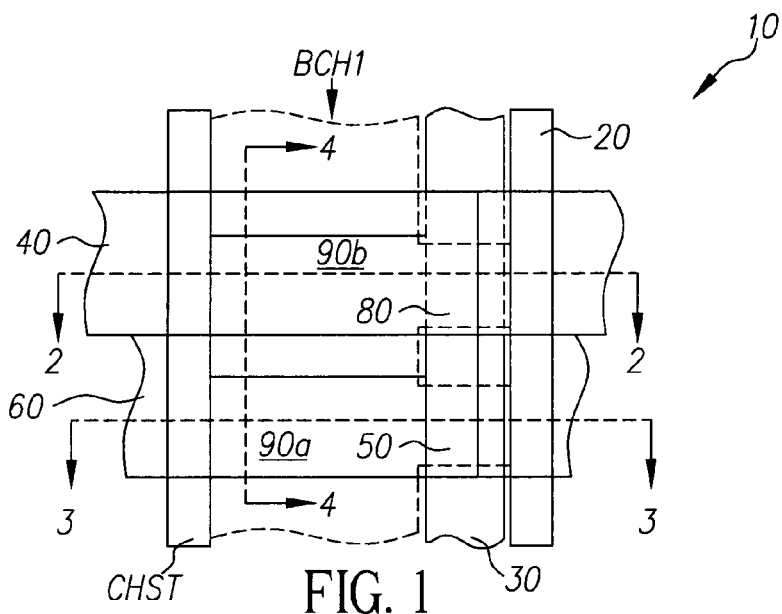
FIG. 1 is a top view of the image sensor of the present invention.
Figure 2:
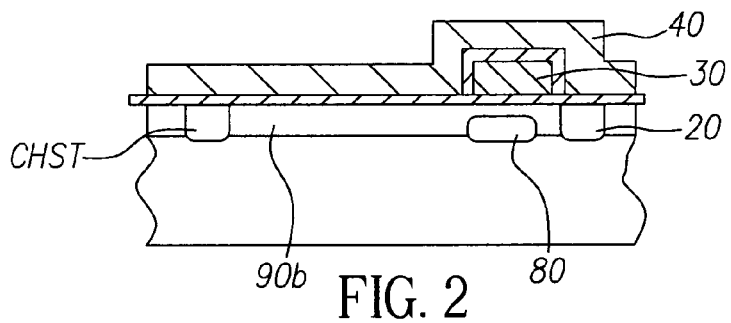
FIG. 2 is a first side view of FIG. 1.
Figure 3:
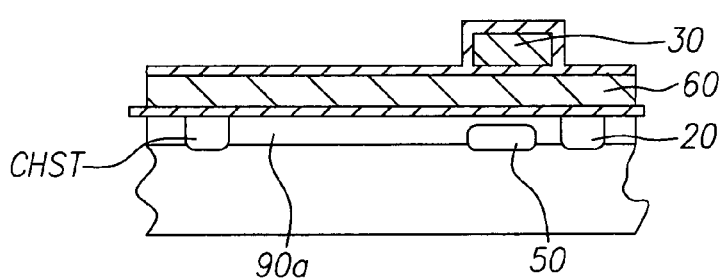
FIG. 3 is a second side view of FIG. 1.
Figure 4:
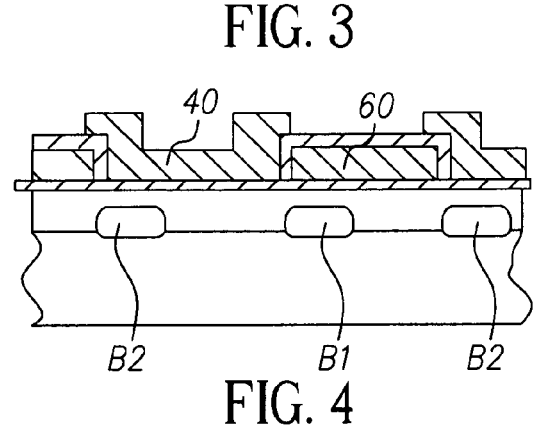
FIG. 4 is a third side view of FIG. 1.

Referring to FIGS. 1, 2, 3 and 4, a top view and various cross-sectional views of the present invention embodied in a full-frame image sensor 10 with a lateral overflow drain (LOD) 20 for antiblooming protection is shown. Particular portions of the antiblooming structure have been described in U.S. Pat. No. 5,130,774 and U.S. Pat. No. 5,349,215. The present invention makes use of the drain region 20 of this prior-art LOD structure as a place to dump the dark current accumulated prior to integration. Hence, no extra pixel area is required by the present invention. To implement the flush feature within the structure, an additional gate electrode layer 30 is added to the process. This additional electrode 30 is placed underneath the electrode 40 for the V2 phase as shown in cross section 2-2. Although the preferred embodiment shows the V2 electrode 40 to be formed out of indium-tin oxide (ITO), it is not a requirement of the present invention. Other materials such as polysilicon may be used, for example. The antiblooming channel region 50 is underneath the V1 phase 60, as usual, where it retains all of the same features and advantages as described in the prior art. It is noted that the fast-flush gate (FFG) electrode 30 runs on top of the polysilicon electrode 60 used to form phase 1, as shown in cross section 3-3. As a result, any gate voltage applied to the FFG 30 will have no effect on the channel potential within the B3 region 50, since it is screened from the B3 region 50 by the V1 electrode 60. A cross section 4-4 through the two-phase CCD in the direction of charge transfer during image readout is shown in FIG. 4.

Figure 5:
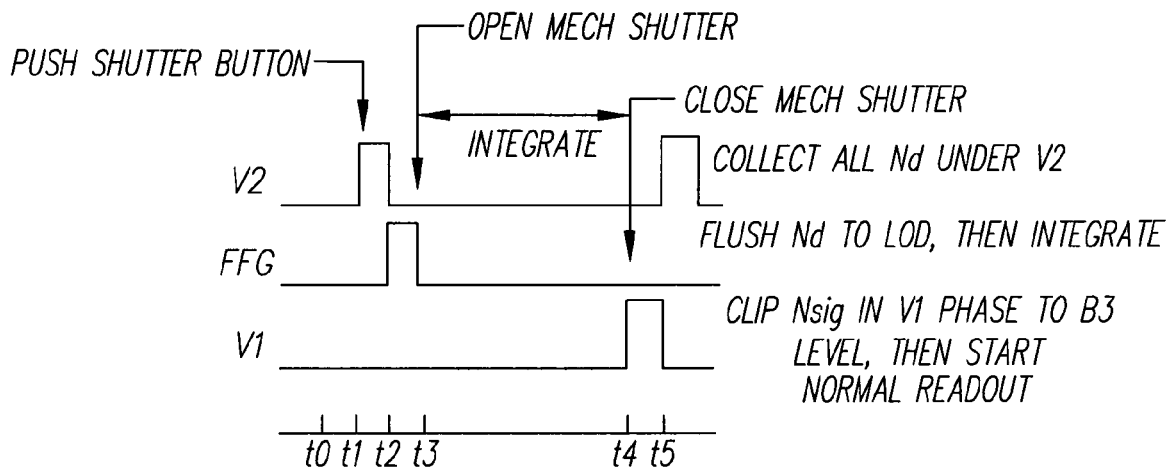
FIG. 5 is a timing diagram for the image sensor of FIG. 1.
Figure 5:
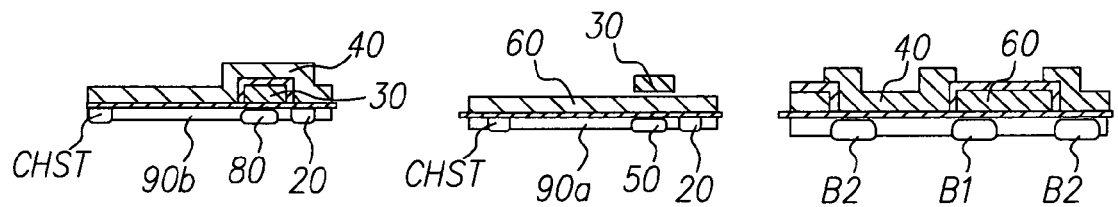
Figure 5:
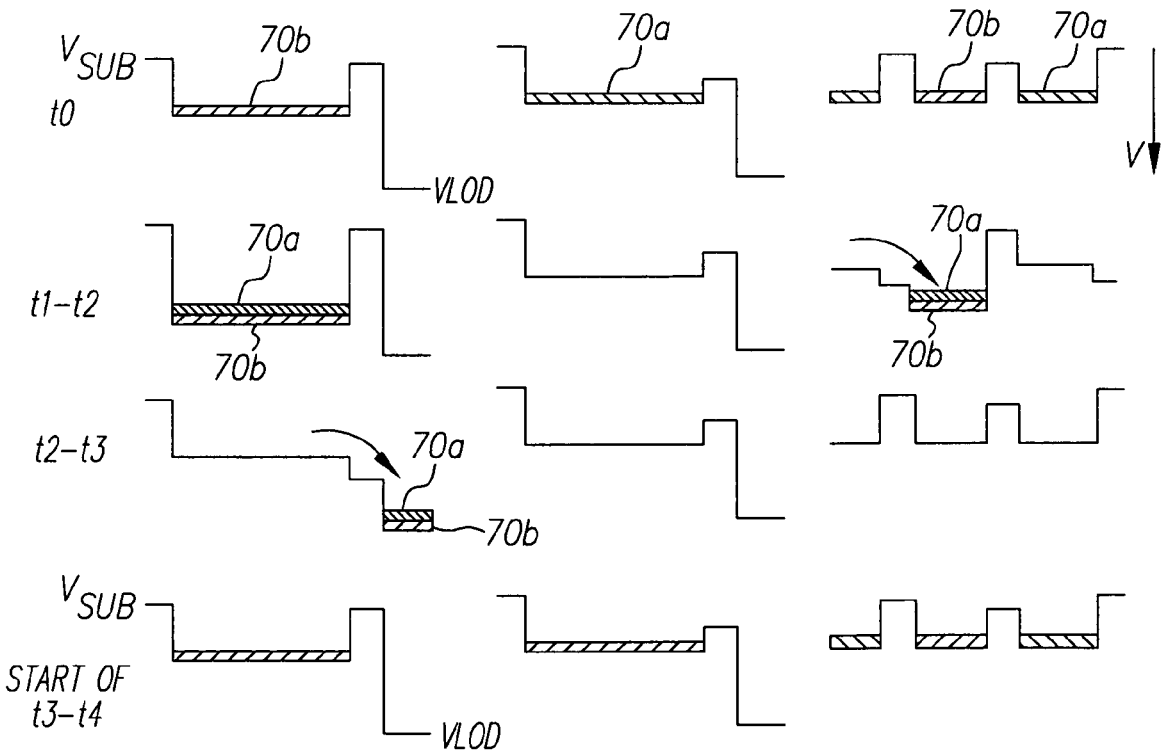
Figure 6:
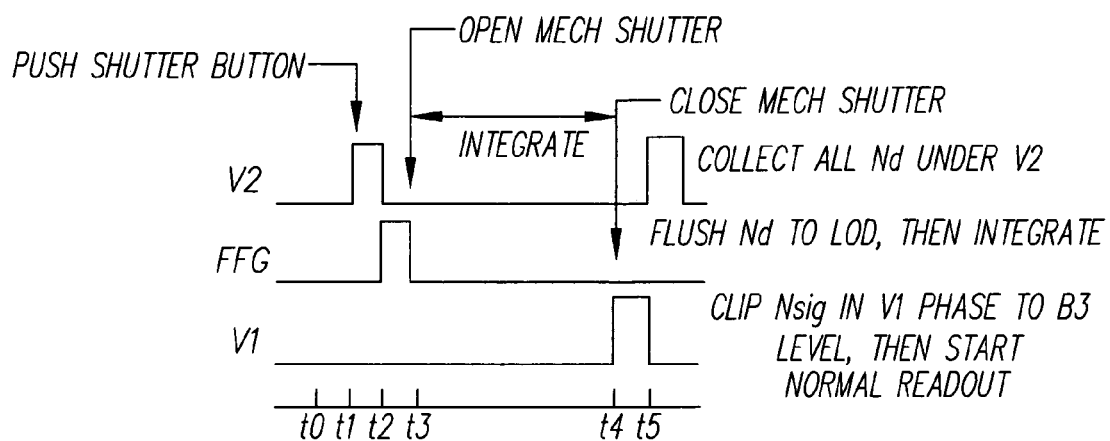
FIG. 6 is another timing diagram of FIG. 5.
Figure 6:
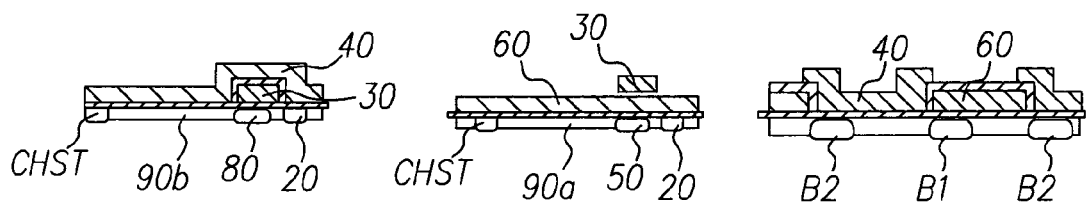
Figure 6:
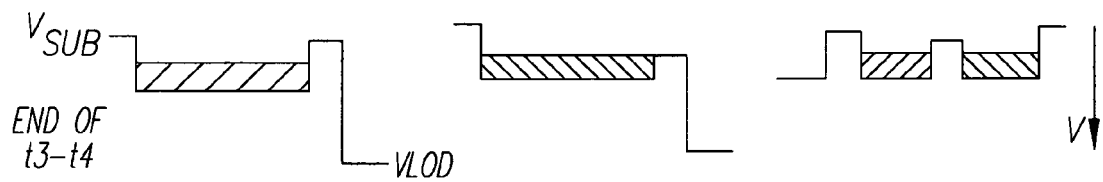
Figure 6:
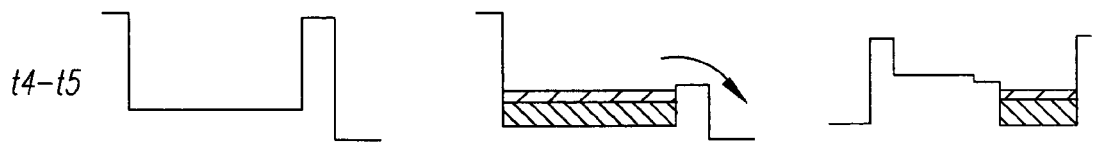

Referring to FIGS. 5 and 6, clocking diagrams along with the resulting channel-potential profiles within the silicon at various time intervals is shown. The time interval prior to when the shutter button is depressed is represented by t<t1. During this time, dark current accumulates within the CCD channel region under both phases V1 and V2, (which are held in accumulation). The dark signal under V1 is noted as 70a and under V2 as 70b. At time t1, the shutter button is depressed and the V2 clock voltage is pulsed high. This has the effect of collecting all of the dark signal 70a and 70b within the potential well under the V2 electrode 40. Then, at time t2, the FFG electrode 30 is pulsed high while the V2 electrode goes low. This results in all of the dark signal (combination of 70a and 70b) accumulated under V2 40 in region 90b to be transferred through the B4 channel region 80 (see FIGS. 1 and 2) and dumped to the LOD 20, where it is swept away by the large positive bias (Vlod) applied to it. It is important that the FFG electrode 30 is clocked high before the V2 electrode 40 is turned off to insure that all the dark charge 70a and 70b dumps to the LOD 20 and none can possibly spill forward into the V1 region 90a (in the n-type region of the substrate). Note that since the fast-flush operation is accomplished by only single short pulses of V2 40 and FFG 30, the shutter latency and power dissipated are both extremely small. At time t3 the FFG 30 is shut off (and remains off) by bringing it to a low voltage, the mechanical shutter is opened, and the integration period begins. It should be pointed out that the timing of the opening of the mechanical shutter with respect to the falling edge of the FFG voltage at t3 is not too critical. It can be delayed some, without much consequence except to increase the shutter delay slightly. It could also overlap into the FFG pulse slightly, which would only result in the integration period not starting until the FFG pulse goes low at t3. It is noted that integration is performed with both V1 60 and V2 40 phases held in accumulation so as to reduce dark current as described in U.S. Pat. No. 5,115,458. The integration period ends at time t4 where the mechanical shutter is closed and conventional, two-phase accumulation-mode readout of the image begins. Readout starts with the V1 gate electrode 60 being pulsed high so as to "clip" or limit the integrated signal to the full-well capacity as defined by the B3 channel potential. (Note that the B3 region potential is made slightly deeper than that of the B1 region. Since the B3 and B1 region potentials "track" one another, this optimizes charge capacity of the pixel while preventing a condition referred to as blooming on transfer.) Therefore, for high exposure levels, any excess above the capacity of the pixel will be dumped to the LOD so that none can potentially spill backwards during image readout. (This backwards spilling is what is known as blooming on transfer.) The V1 pulse is followed by a V2 pulse (high) at t5, as is the convention. Subsequent line transfers follow in the usual manner for this mode of clocking.

The invention has been described with reference to a preferred embodiment. However, it will be appreciated that variations and modifications can be effected by a person of ordinary skill in the art without departing from the scope of the invention.

PARTS LIST

10 image sensor
20 lateral overflow drain
30 fast flush gate electrode
40 V2 phase electrode
50 antiblooming channel region
60 V1 phase electrode
70a dark signal from V1 phase
70b dark signal from V2 phase
80 fast flush channel region
90a V1 storage region
90b V2 storage region

The invention claimed is:

1. An image sensor comprising:
    (a) a substrate;
    (b) a plurality of pixels on the substrate, one or more of the pixels comprising:
        (i) a first charge-storage region covered by a first electrode of a first electrode layer;
        (ii) a second charge-storage region having at least one photosensitive area and covered by a second electrode of a second electrode layer;
        (iii) a lateral overflow drain;
        (iv) a fast flush gate formed of a third electrode and a third electrode layer and adjacent the second charge-storage region that passes substantially all charges from the second charge-storage region to the lateral overflow drain; and
        (v) a lateral gate formed by a contiguous portion of the first electrode layer and adjacent the first charge-storage region that passes excess photo-generated charge into the lateral overflow drain for blooming control.

2. The image sensor as in claim 1, wherein the first charge-storage region passes substantially all its charges to the second charge-storage region before the fast flush gate passes all charges to the lateral overflow drain.

3. A camera comprising:
    an image sensor comprising:
    (a) a substrate;
    (b) a plurality of pixels on the substrate, one or more of the pixels comprising:
        (i) a first charge-storage region covered by a first electrode of a first electrode layer;
        (ii) a second charge-storage region having at least one photosensitive area and covered by a second electrode of a second electrode layer;
        (iii) a lateral overflow drain;
        (iv) a fast flush gate formed of a third electrode and a third electrode layer and adjacent the second charge-storage region that passes substantially all charges from the second charge-storage region to the lateral overflow drain; and
        (v) a lateral gate formed by a contiguous portion of the first electrode layer and adjacent the first charge-storage region that passes excess photo-generated charge into the lateral overflow drain for blooming control.

4. The camera as in claim 3, wherein the first charge-storage region passes all its charges to the second charge-storage region before the fast flush gate passes all charges to the lateral overflow drain.

* * * * *